United States Patent
Das et al.

(10) Patent No.: US 6,822,472 B1
(45) Date of Patent: Nov. 23, 2004

(54) DETECTION OF HARD MASK REMAINING ON A SURFACE OF AN INSULATING LAYER

(75) Inventors: Sanjit K. Das, Pougkeepsie, NY (US); Anthony K. Stamper, Williston, VT (US); Eric J. White, Charlotte, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/604,134

(22) Filed: Jun. 27, 2003

(51) Int. Cl.[7] ............................................... G01R 31/26
(52) U.S. Cl. ..................................... 324/765; 324/158.1
(58) Field of Search ................................ 324/765, 500, 324/501, 716, 719, 766, 158.1; 702/108, 155

(56) References Cited

U.S. PATENT DOCUMENTS

| | | | |
|---|---|---|---|
| 4,632,561 A | * | 12/1986 | Rosencwaig et al. ....... 356/432 |
| 4,750,822 A | * | 6/1988 | Rosencwaig et al. ....... 356/445 |
| H000589 H | | 2/1989 | Sartore |
| 4,854,710 A | * | 8/1989 | Opsal et al. ................. 356/432 |
| 4,933,635 A | | 6/1990 | Deutsch et al. |
| 5,023,561 A | | 6/1991 | Hillard |
| 5,073,755 A | | 12/1991 | Neufeld |
| 5,081,421 A | | 1/1992 | Miller et al. |
| 5,182,452 A | | 1/1993 | Niwa et al. |
| 5,528,153 A | | 6/1996 | Taylor et al. |
| 5,952,674 A | | 9/1999 | Edelstein et al. |
| 6,020,264 A | | 2/2000 | Lustig et al. |
| 6,054,868 A | | 4/2000 | Borden et al. |
| 6,136,615 A | | 10/2000 | Nelson et al. |
| 6,281,024 B1 | | 8/2001 | Yoshitake et al. |
| 6,407,386 B1 | | 6/2002 | Dotan et al. |
| 2002/0093648 A1 | | 7/2002 | Nikoonahad et al. |
| 2002/0097406 A1 | | 7/2002 | Fielden et al. |
| 2002/0102749 A1 | | 8/2002 | Fielden et al. |
| 2002/0103564 A1 | | 8/2002 | Fielden et al. |
| 2002/0106848 A1 | | 8/2002 | Wack et al. |
| 2002/0107650 A1 | | 8/2002 | Wack et al. |

* cited by examiner

Primary Examiner—David Zarneke
Assistant Examiner—Tung X. Nguyen
(74) Attorney, Agent, or Firm—Schmeiser, Olsen & Watts; William D. Sabo

(57) ABSTRACT

A detection system and method including a means for performing a test on a semiconductor device and obtaining test data therefrom. The semiconductor device includes an insulating layer, a hard mask layer on a surface of the insulating layer, and a plurality of electrically conductive lines within a trench in the insulating layer. The insulating layer comprises a first dielectric material. The hard mask layer comprises a second dielectric material. The dielectric constant of the second dielectric material exceeds the dielectric constant of the first dielectric material or the second dielectric material comprises an element that is not comprised by the first dielectric material. The test data is a function of a spatial distribution of the hard mask layer on the surface of the insulating layer. The detection system and method includes a means for determining from the test data a measure of the spatial distribution of the hard mask layer on the surface of the insulating layer.

20 Claims, 14 Drawing Sheets

FIG. 1B
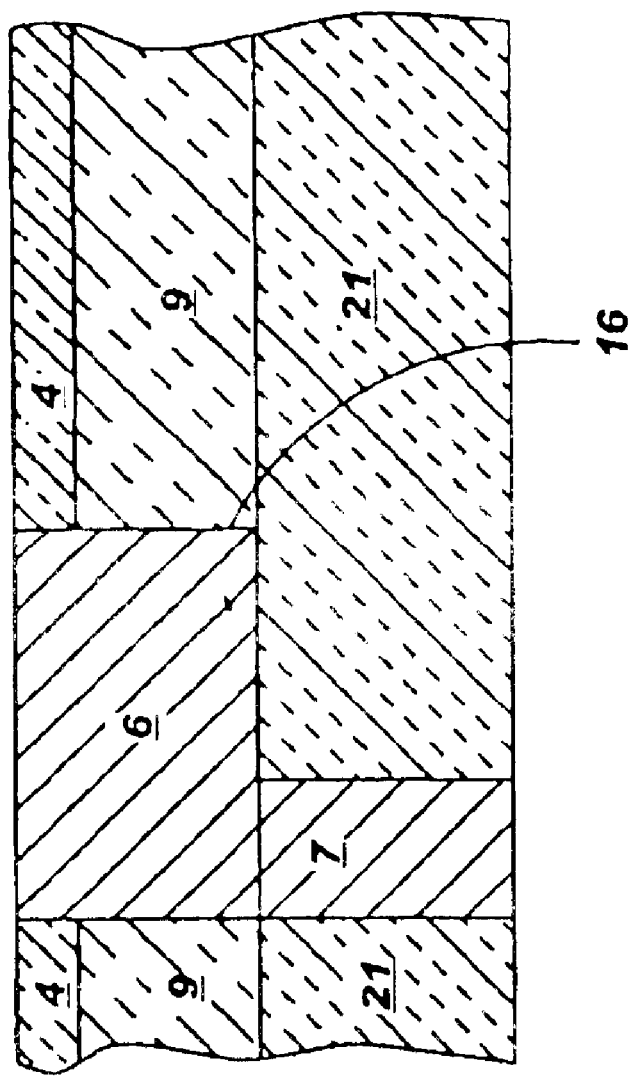

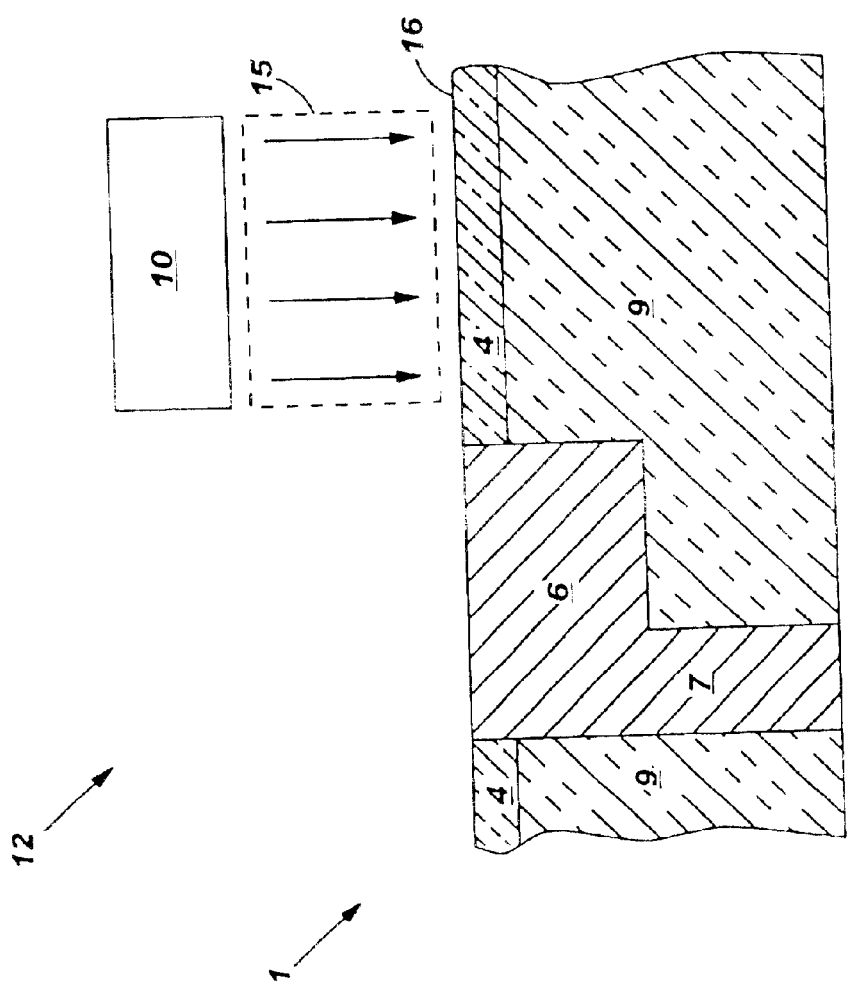

FIG. 12

| | 1 | 2 | 3 | 4 | 5 | 6 | 7 | 8 | 9 | 10 | 11 | 12 | 13 | 14 | 15 | 16 | 17 | 18 | 19 | 20 | 21 | 22 |
|---|---|---|---|---|---|---|---|---|---|---|---|---|---|---|---|---|---|---|---|---|---|---|
| 22 | | | | | | | | | | -7755.00000 -6888.00000 | | | | | | | | | | | | |
| 21 | | | | | | | | | | | | | | | | | | | | | | |
| 20 | | | | | | | | | | | | | | | | | | | | | | |
| 19 | | | | 0.06631 0.76680 | | | 0.06566 0.77797 | | | 0.06530 0.78755 | | | 0.06506 0.78839 | | | 0.06603 0.77498 | | | | | | |
| 18 | | | | | | | | | | | | | | | | | | | | | | |
| 17 | | | | | | | | | | | | | | | | | | | | | | |
| 16 | 0.06776 0.69864 | | | 0.06545 0.78353 | | | 0.06393 0.79916 | | | 0.06331 0.80745 | | | 0.06315 0.80799 | | | | | | 0.06541 0.78869 | | | |
| 15 | | | | | | | | | | | | | | | | | | | | | | |
| 14 | | | | 0.06495 0.79027 | | | 0.06308 0.80851 | | | 0.06275 0.81187 | | | 0.06299 0.81205 | | | 0.06272 0.81313 | | | | | | |
| 13 | | | | | | | | | | | | | | | | | | | | | | |
| 12 | 0.06357 0.76296 | | | 0.06555 0.78369 | | | 0.06234 0.81822 | | | 0.06229 0.81736 | | | 0.06291 0.71154 | | | 0.06274 0.81455 | | | | | |
| 11 | | | | | | | | | | | | | | | | | | | | | | |
| 10 | | | | 0.06512 0.78762 | | | 0.06273 0.81353 | | | 0.06210 0.82091 | | | | | | | | | | | |
| 9 | | | | | | | | | | | | | | | | | | | | | | |
| 8 | | | | | | | | | | | | | | | | | | | | | | |
| 7 | | | | | | | 0.06443 0.79595 | | | 0.06332 0.80882 | | | 0.06316 0.80727 | | | -7755.00000 -6888.00000 | | | 0.06400 0.80365 | | | |
| 6 | | | | | | 0.06611 0.75358 | | | | | | | | | | | | | | | | |
| 5 | 0.06609 0.76915 | | | 0.06665 0.76420 | | | | | | 0.06522 0.78410 | | | 0.06569 0.78712 | | | 0.06582 0.77922 | | | 0.06657 0.77446 | | | 0.06672 0.77104 |
| 4 | | | | | | | | | | | | | | | | | | | | | | |
| 3 | | | | | | | | | | | | | | | | | | | | | | |
| 2 | | | | | | | | | | | | | | | | | | | | | | |
| 1 | | | | | | | | | | | | | | | | | | | | | | |

DETECTION OF HARD MASK REMAINING ON A SURFACE OF AN INSULATING LAYER

BACKGROUND OF INVENTION

1. Technical Field

The present invention relates to a system and associated method to detect hard mask on a dielectric.

2. Related Art

Electrical device fabrication typically requires specified measurements during fabrication. Specified measurements may not be possible to be made during fabrication. Thus there is a need to make specified measurements during fabrication of electrical devices.

SUMMARY OF INVENTION

The present invention provides a detection system comprising:

means for performing a test on a semiconductor device and obtaining test data therefrom, wherein the semiconductor device includes an insulating layer, a hard mask layer on a surface of the insulating layer, and a plurality of electrically conductive lines within a trench in the insulating layer, wherein the insulating layer comprises a first dielectric material, wherein the hard mask layer comprises a second dielectric material, wherein the dielectric constant of the second dielectric material exceeds the dielectric constant of the first dielectric material or the second dielectric material comprises an element that is not comprised by the first dielectric material, and wherein the test data is a function of a spatial distribution of the hard mask layer on the surface of the insulating layer; and means for determining from said test data a measure of said spatial distribution of the hard mask layer on the surface of the insulating layer.

The present invention provides a detection method comprising:

performing a test on a semiconductor device and obtaining test data therefrom, wherein the semiconductor device includes an insulating layer, a hard mask layer on a surface of the insulating layer, and a plurality of electrically conductive lines within a trench in the insulating layer, wherein the insulating layer comprises a first dielectric material, wherein the hard mask layer comprises a second dielectric material, wherein the dielectric constant of the second dielectric material exceeds the dielectric constant of the first dielectric material or the second dielectric material comprises an element that is not comprised by the first dielectric material, and wherein the test data is a function of a spatial distribution of the hard mask layer on the surface of the insulating layer; and determining from said test data a measure of said spatial distribution of the hard mask layer on the surface of the insulating layer.

BRIEF DESCRIPTION OF DRAWINGS

FIG. 1B illustrates a cross-sectional view of the semiconductor device of FIG. 1a comprising a silicon based dielectric.

FIG. 2 illustrates a system to detect a presence of the hard mask remaining on the semiconductor device of FIGS. 1a and 1b, in accordance with embodiments of the present invention.

FIG. 12 illustrates a wafer map comprising capacitance and resistance data for one semiconductor device related to the semiconductor device in FIG. 10, in accordance with embodiments of the present invention.

DETAILED DESCRIPTION

Figure 1A:
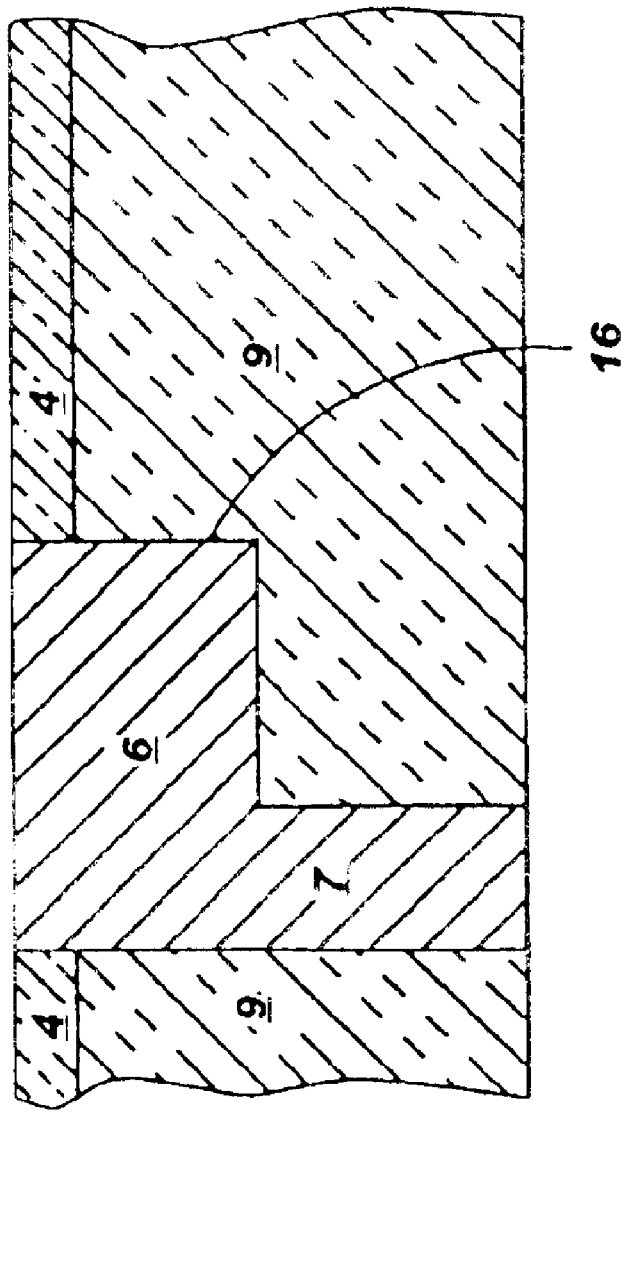
FIG. 1A illustrates a cross-sectional view of a semiconductor device comprising a conductive line, in accordance with embodiments of the present invention.

FIG. 1A illustrates a cross-sectional view of a semiconductor device 1 comprising a conductive line 6 and a via 7, in accordance with embodiments of the present invention. The conductive line 6 (i.e., circuit lines or wires for electrically coupling electrical components on a semiconductor device) and the via 7 (i.e., to electrically couple lines or wires on a plurality of different levels on a semiconductor device) were created using a damascene process. Note that FIG. 1 shows that the conductive line 6 and the via 7 were created using a dual damascene process, although a single damascene process may be used. Any damascene process know to a person of ordinary skill in the art may be used (i.e., single damascene process, dual damascene process, etc). The conductive line 6 is formed within a trench 16. During the damascene process of the present invention it is highly desirable to leave a small amount of hard mask 4 remaining on an insulating layer 9 after creating the conductive line(s) 6 and the via(s) 7 so that the insulating layer 9 is not exposed to any additional processing steps (i.e., copper/liner chemical mechanical polish (CMP), post CMP cleans, post CMP plasma treatments or dielectric depositions, etc) during fabrication of the semiconductor device 1. Additionally, the semiconductor device 1 may be sensitive to moisture during or after fabrication and the remaining hard mask 4 helps to protect the semiconductor device 1 from moisture ingress. The hard mask 4 may comprise a preferred level of thickness of about 10 nanometers (nm) to about 100 nm. The preferred level of thickness of the hard mask 4 may comprise about 10–20 percent of a level of thickness of the conductive line 6. The insulating layer 9 may be a low k dielectric comprising a relative dielectric coefficient about 1 to about 4. The low k dielectric may be, inter alia, a porous dielectric with micro-pores, a polymer based dielectric, an inorganic dielectric, etc. The hard mask 4 may be an inorganic non-polymer silicon based dielectric (e.g., one or more of, $SiO_2$, $SiN_X$, $SiC_X$, $SiO_XN_Y$, $SiO_XC_Y$, $SiO_XC_YH_Z$, $SiC_XN_Y$, etc). A dielectric constant of the hard mask 4 is higher than the dielectric constant of the insulating layer 9. A relative dielectric constant of the hard mask 4 may be in a range of about 3.0 to about 7.5. The present invention exploits the difference in dielectric constant of the insulating layer 9 and the hard mask 4. The semiconductor device 1 may comprise a semiconductor wafer and may comprise a plurality of levels. The conductive line(s) 6 and the via(s) 7 may comprise a conductive metal such as, inter alia, copper.

FIG. 1B illustrates a cross-sectional view of the semiconductor device 1 of FIG. 1A comprising a conductive line 6 and a via 7 with a silicon based dielectric 21, in accordance with embodiments of the present invention. In contrast with FIG. 1a, FIG 1b comprises the silicon based dielectric 21 under insulating layer 9.

FIG. 2 illustrates a system 12 to detect a presence of the hard mask 4 remaining on the semiconductor device 1 of FIGS. 1a and 1b, in accordance with embodiments of the present invention. A device 10 is adapted to emit a primary beam 15 comprising either electrons or photons and direct the primary beam 15 onto the semiconductor device 1. FIG. 2 may relate to either FIG. 1A or FIG. 1B.

Figure 3:
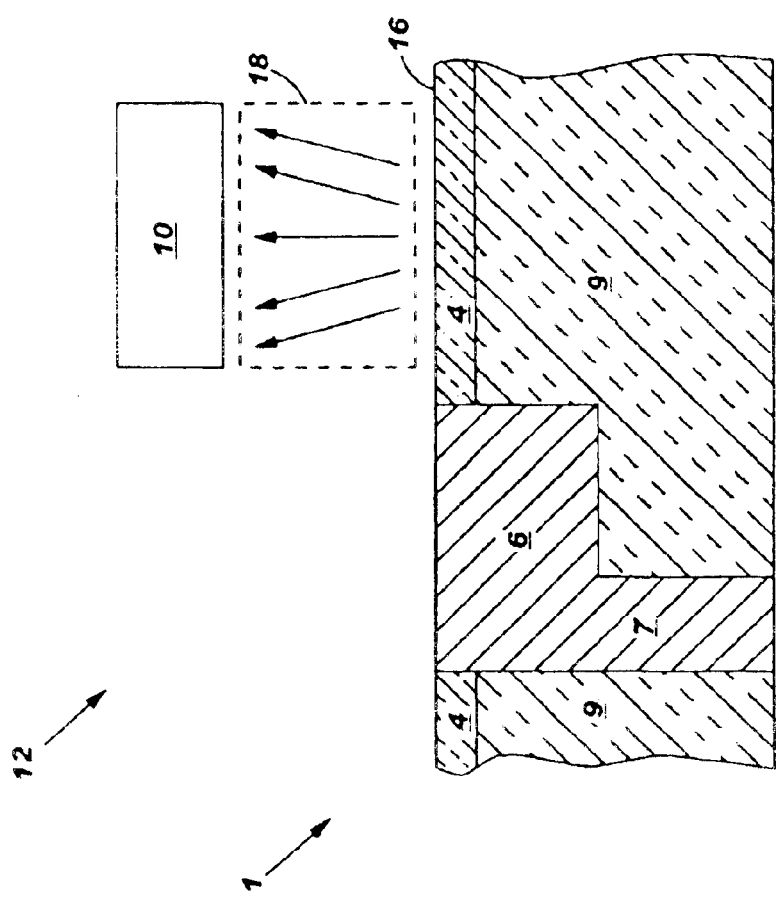
FIG. 3 illustrates the system of FIG. 2 retrieving a secondary beam from the semiconductor device, in accordance with embodiments of the present invention.

FIG. 3 illustrates the system 12 of FIG. 2 retrieving a secondary beam 18 of electrons or photons from the semiconductor device 1, in accordance with embodiments of the present invention. The device 10 is adapted to measure a stoichiometry of the secondary beam 18 of electrons or photons retrieved from the semiconductor device 1 using any method known to a person of ordinary skill in the such as, inter alia, energy dispersive x-ray fluorescence (EDXRF), energy dispersive x-ray spectroscopy (EDX). FIG. 3 may relate to either FIG. 1a or FIG. 1b. With reference to FIGS. 2 and 3, the present invention comprises two embodiments.

In a first embodiment, the device 10 emits the primary beam 15 comprising photons. The primary beam 15 of photons comprises a known energy level ($E_{in}$). The primary beam 15 of photons is directed onto the semiconductor device 1 in areas where there is or should be hard mask 4. The photons penetrate the hard mask 4 or the insulating layer 9 (in the case that there is not any hard mask remaining) causing electrons to be released from the hard mask 4 or the insulating layer 9, thereby causing the secondary beam 18 to comprise electrons. The secondary beam 18 of electrons is retrieved by the device 10. The device 10 measures an energy level ($E_{out}$) of the secondary beam 18 of electrons and based on a formula ($E_{in}-E_{out}$), an energy absorbed ($E_{AB}$) by the hard mask 4 or the insulating layer 9 is used to identify a dielectric material (i.e., the hard mask 4 or the insulating layer 9). Therefore $E_{AB}$ determines whether or not the hard mask 4 exists on the insulating layer 9. Although not necessary, calibration data could be used to determine whether or not hard mask 4 remains on the insulating layer 9. The calibration data would include test data comprising calculated $E_{AB}$'s for a plurality of dielectrics for comparison with the calculated EAB of the semiconductor device 1.

In a second embodiment, the device 10 emits the primary beam 15 comprising electrons. The primary beam 15 of electrons may comprise a known energy level ($E_{in}$). The primary beam 15 of electrons is directed onto the semiconductor device 1 in areas where there is or should be hard mask 4. The electrons penetrate the hard mask 4, the insulating layer 9 (in the case that there is not any hard mask remaining), or both the hard mask 4 and the insulating layer 9 causing photons to be released thereby causing the secondary beam 18 to comprise photons. The secondary beam 18 of photons is retrieved by the device 10. The device 10 measures an energy level ($E_{out}$) of the secondary beam 18 of photons. The $E_{out}$ of the secondary beam 18 of photons is compared with calibration test data to determine a level of thickness of the hard mask 4. The calibration test data is obtained by using a same $E_{in}$ as comprised by the primary beam 15 of electrons and measuring an $E_{out}$ for a plurality of different hard mask thicknesses including no hard mask. As an alternative, the test data may be obtained by using a different $E_{in}$ as comprised by the primary beam 15 of electrons, measuring an $E_{out}$ for a plurality of different hard mask thicknesses including no hard mask, and using a ratio of $E_{out}/E_{in}$ as a basis for comparison.

Although any area on the semiconductor device 1 may be scanned, the optimal section should be an area that comprises a high conductive line 6 pattern factor (i.e., a plurality of conductive lines comprising spaces between conductive lines 0.2–1 microns in width) because the high conductive line 6 pattern factor represents an area that is likely to have a lesser amount of hard mask therefore representing a worst case scenario (e.g., an area with a 90% pattern factor comprising; 18 micron wide conductive lines and 2 microns wide spaces between the conductive lines or 1.8 micron wide conductive lines and 0.2 microns wide spaces between the conductive lines). The section of the semiconductor device 1 shown in FIGS. 1–3 represents an active section (i.e., actual current/signal paths for the semiconductor device 1) of the semiconductor device 1.

Figure 4A:
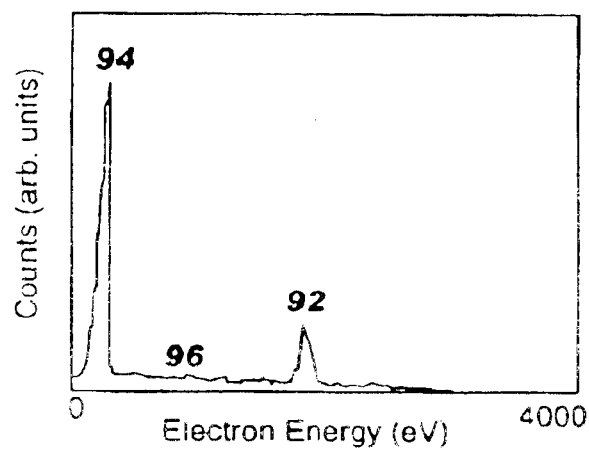
FIGS. 4A, 4B, and 4C each illustrate a graph for FIG. 1B in reference to the description of FIGS. 2 and 3, in accordance with embodiments of the present invention.
Figure 4B:
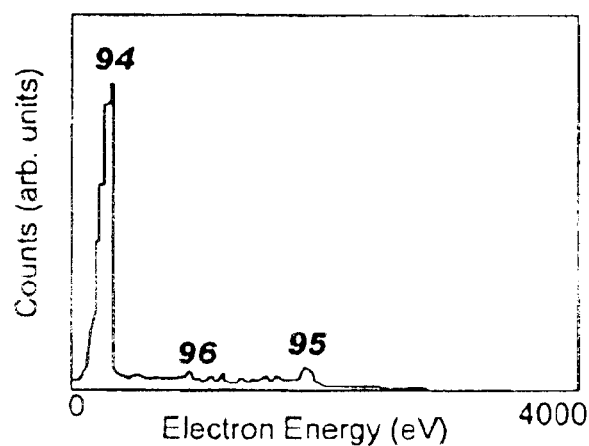
Figure 4C:
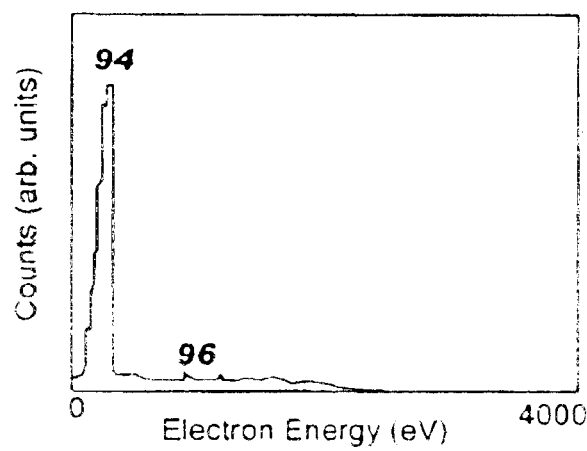

FIGS. 4A, 4B, and 4C each illustrate a graph for FIG. 1B in reference to the description of FIGS. 2 and 3, showing data comprising peak intensity verses a wavelength, in accordance with embodiments of the present invention. The Y-axis of the graph represents counts (i.e., counts of incident photons or electrons). The X-axis of the graph represents electron energy in electron volts (eV). The graph in FIG. 4A represents the semiconductor device 1 of FIGS. 1–3 with the hard mask 4 remaining over the insulating layer 9. The hard mask 4 represented by a peak wave pattern 92 comprises an inorganic non-polymer silicon based dielectric. The insulating layer 9 represented by a peak wave pattern 94 comprises a carbon based dielectric such as, inter alia, SiLKÂ® manufactured by Dow Chemical. The conductive line 6 represented by a peak wave pattern 96 comprises copper. Note that a thickness of the hard mask 4 layer may be calculated based on the intensity of the peak wave pattern 92 (i.e., silicon peak) using calibration data as discussed in the description of FIG. 3.

The graph in FIG. 4B represents the semiconductor device 1 of FIG. 1A without any hard mask 4 remaining over the insulating layer 9. The insulating layer 9 represented by a peak wave pattern 94 comprises a carbon based dielectric such as, inter alia, SiLKÂ® manufactured by Dow Chemical and is relatively thin (i.e., 220 nm). The conductive line 6 represented by a peak wave pattern 96 comprises copper. The peak wave pattern 95 represents a small silicon peak resulting from the silicon based dielectric 21 under the relatively thin insulating layer 9.

The graph in FIG. 4C represents the semiconductor device 1 of FIG. 1B without any hard mask 4 remaining over the insulating layer 9. The insulating layer 9 represented by a peak wave pattern 94 comprises a carbon based dielectric such as, inter alia, SiLKÂ® manufactured by Dow Chemical. The insulating layer 9 in graph 4c (i.e., 600 nm) comprises a higher thickness than in graph 4b. The conductive line 6 represented by a peak wave pattern 96 comprises copper. Note that the peak wave pattern 92 of FIGS. 4A–B is not present in FIG. 4C because the insulating layer 9 is too thick for the device 10 to detect the silicon based dielectric 21 below the insulating layer 9 and there is no hard mask 4 remaining on the semiconductor device 1.

Figure 5A:
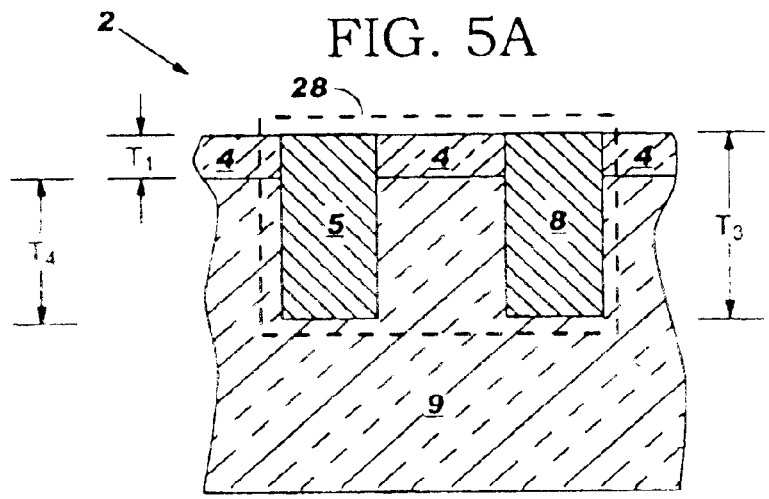
FIGS. 5A, 5B, and 5C each illustrate a cross-sectional view of a semiconductor device comprising a different thickness of hard mask, in accordance with embodiments of the present invention.
Figure 5B:
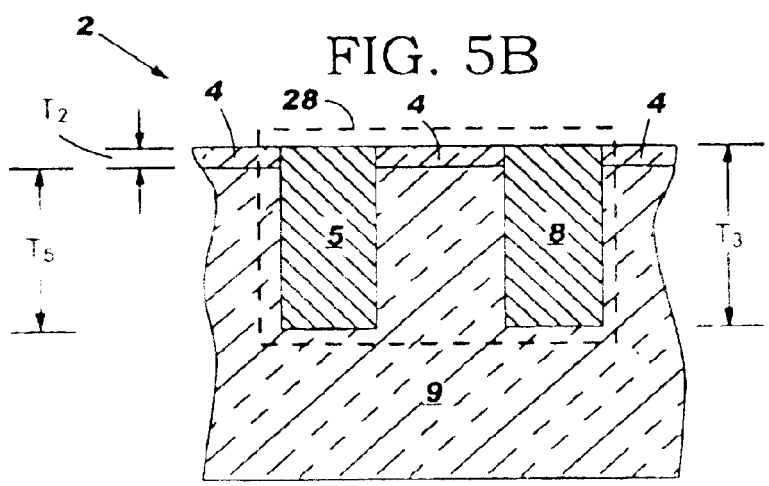
Figure 5C:
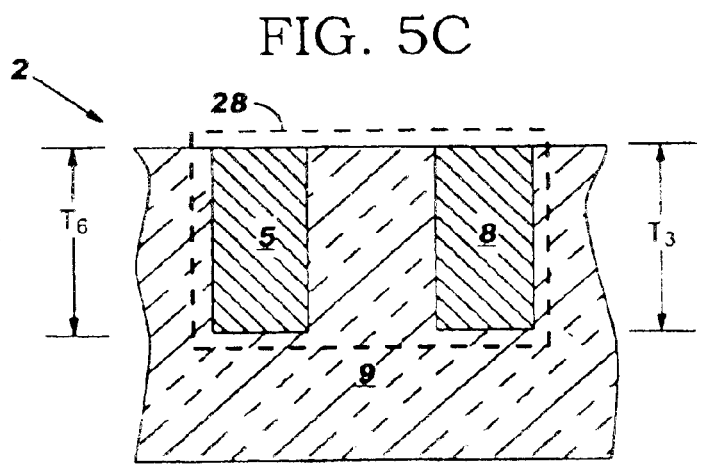

FIGS. 5A, 5B, and 5C illustrate a cross-sectional view of a semiconductor device 2 comprising a conductive line 5 and a conductive line 8 created using a damascene process, in accordance with embodiments of the present invention. The semiconductor device 2 is similar to the semiconductor device 1 of FIGS. 1–3. The hard mask 4 may comprise a uniform thickness (i.e., $T_1$ in FIG. 5a or $T_2$ in FIG. 5b). Alternatively, hard mask 4 may comprise a plurality of thicknesses. FIG. 5c shows the semiconductor device 2 without any hard mask 4. In contrast with FIGS. 1–3, FIGS. 4A–C represent a section of the semiconductor device 2, which is known to be sensitive to hard mask thickness variation or absence. The section may be part of a dicing channel on a semiconductor Wafer and the section may be discarded after fabrication of the semiconductor device 2. Alternatively, the section may be an active section of the semiconductor device 2. The conductive line 5 is not electrically coupled to the conductive line 8. The conductive line 5 forms a pattern (i.e., dense wiring maze) with the conductive line 8 such that the hard mask 4 and the insulating layer 9 is between the conductive line 5 and the conductive line 8 thereby forming a capacitor 28. The capacitor 28 is formed by the conductive line 5, the conductive line 8, and the dielectric material there between. The dielectric material is the combination of the insulating layer 9 and the hard mask 4. The conductive line 5 represents a first plate in the capacitor 28 and the conductive line 6 represents a second plate in the capacitor 28. If the hard mask 4 thickness increases, the capacitance between the conductive line 5 and the conductive line 8 increases since the hard mask 4 has a higher relative dielectric constant than does the insulating layer 9. Similarly, as the hard mask 4 thickness decreases, so does the capacitance between the conductive line 5 and the conductive line 8. The semiconductor device 2 may comprise a plurality of capacitors (i.e., capacitor 28) and a capacitance measurement for each of the plurality of capacitors may be normalized such that each of the capacitance measurements is divided by a median value (i.e., 50th percentile) for the plurality of capacitance measurements thereby causing the median of the capacitance measurements to be 1. The capacitance of the capacitor 28 is used to detect a presence or amount of hard mask 4 remaining on a plurality of insulating layers 9 on a plurality of levels on the semiconductor device 2 during manufacturing of the semiconductor device 2. An example of the aforementioned relationship is described with reference to FIGS. 5A–C. With reference to FIGS. 5A–C, for illustrative purposes, we assume that the wire width and the space between wires is a constant value of 200 nm for all drawings.

The hard mask 4 in FIG. 5A comprises a thickness $T_1$ of about 60 nanometers (nm) and a relative dielectric constant of about 4.5. The insulating layer 9 comprises a thickness $T_4$ between the conductive line 5 and the conductive line 8 of about 240 nm and a relative dielectric constant of about 2.6. The conductive line 5 and the conductive line 8 each comprise a thickness $T_3$ (i.e., wire height) of about 300 nm. A capacitance between the conductive line 5 and the conductive line 8 is about 1.14.

The hard mask 4 in FIG. 5B comprises a thickness $T_2$ of about 20 nm and a relative dielectric constant of about 4.5. The insulating layer 9 comprises a thickness $T_5$ between the conductive line 5 and the conductive line 8 of about 280 nm and a relative dielectric constant of about 2.6. The conductive line 5 and the conductive line 8 each comprise a thickness $T_3$ (i.e., wire height) of about 300 nm. A capacitance between the conductive line 5 and the conductive line 8 is about 1.05.

FIG. 5C does not comprise any hard mask 4. The insulating layer 9 comprises a thickness $T_6$ between the conductive line 5 and the conductive line 8 of about 300 nm and a relative dielectric constant of about 2.6. The conductive line 5 and the conductive line 8 each comprise a thickness $T_3$ (i.e., wire height) of about 300 nm. A capacitance between the conductive line 5 and the conductive line 6 is about 1.00.

The aforementioned values (i.e., thicknesses of hard mask, conductive lines, and insulating layer, relative dielectric constants, and capacitances) are used to describe the aforementioned relationship such that if the hard mask 4 thickness increases, the capacitance between the conductive line 5 and the conductive line 8 increases since the hard mask 4 has a higher relative dielectric constant than does the insulating layer 9. Note that any values may be used.

Figure 6:
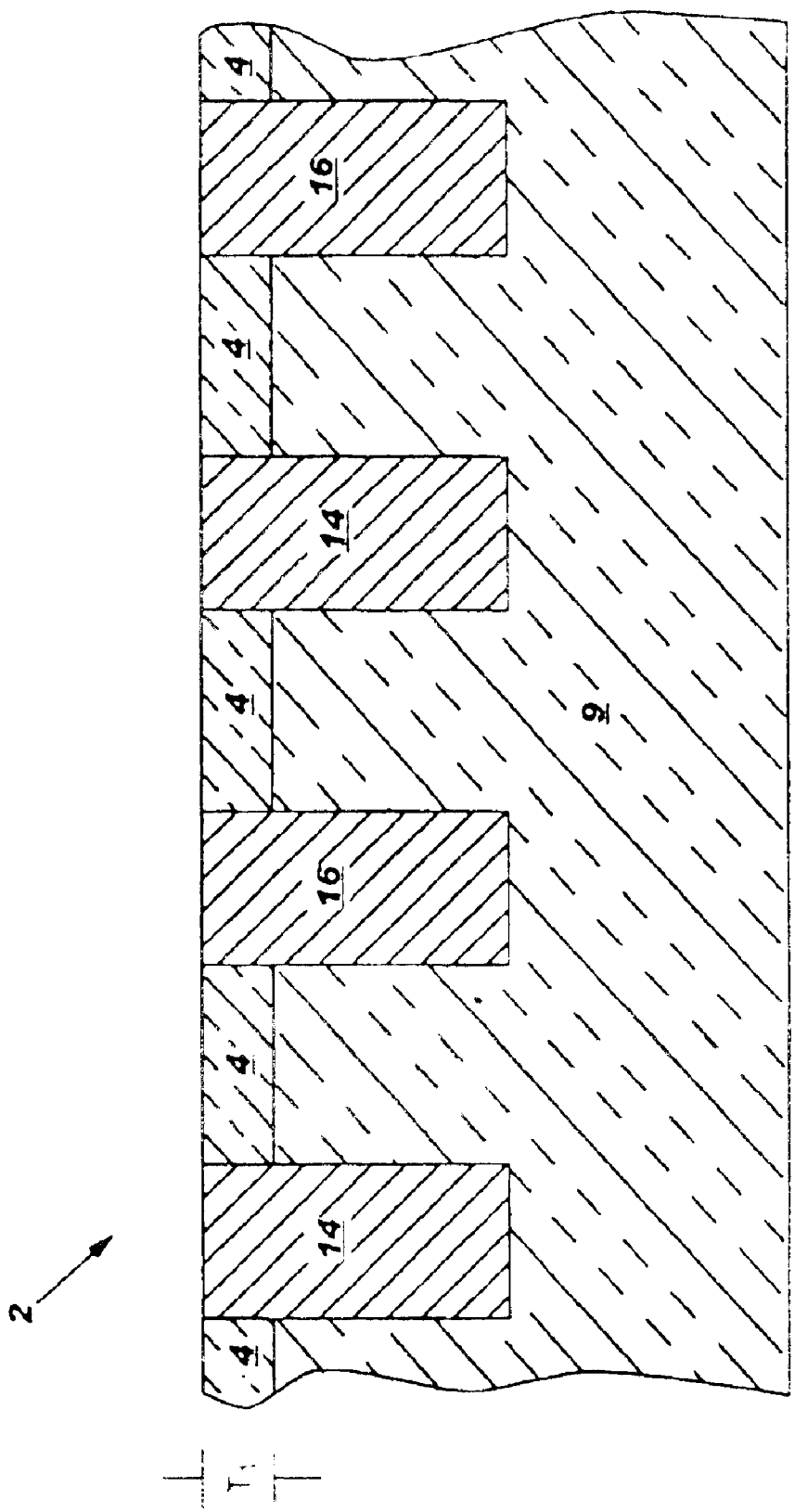
FIG. 6 illustrates a cross-sectional view of a semiconductor device created using a damascene process, in accordance with embodiments of the present invention.

FIG. 6 illustrates a cross-sectional view of a semiconductor device 2 comprising a conductive line 14 and a conductive line 16 created using a damascene process, in accordance with embodiments of the present invention. The semiconductor device 2 is similar to the semiconductor device 1 of FIGS. 1–3. The hard mask 4 may comprise a uniform thickness (i.e., T1). Alternatively, hard mask 4 may comprise a plurality of thicknesses. In contrast with FIGS. 1–3, FIG. 4 represents a section of the semiconductor device 2 which is known to be sensitive to hard mask thickness variation or absence. The section may be part of a dicing channel on a semiconductor wafer and the section may be discarded after fabrication of the semiconductor device 2. The conductive line 14 is not electrically coupled to the conductive line 16. The conductive line 14 forms a pattern (i.e., dense wiring maze) with the conductive line 16 such that the hard mask 4 and the insulating layer 9 is between the conductive line 14 and the conductive line 16 (see FIG. 7 for top view) thereby forming a capacitor 28 (see FIGS. 7 and 8).

Figure 7:
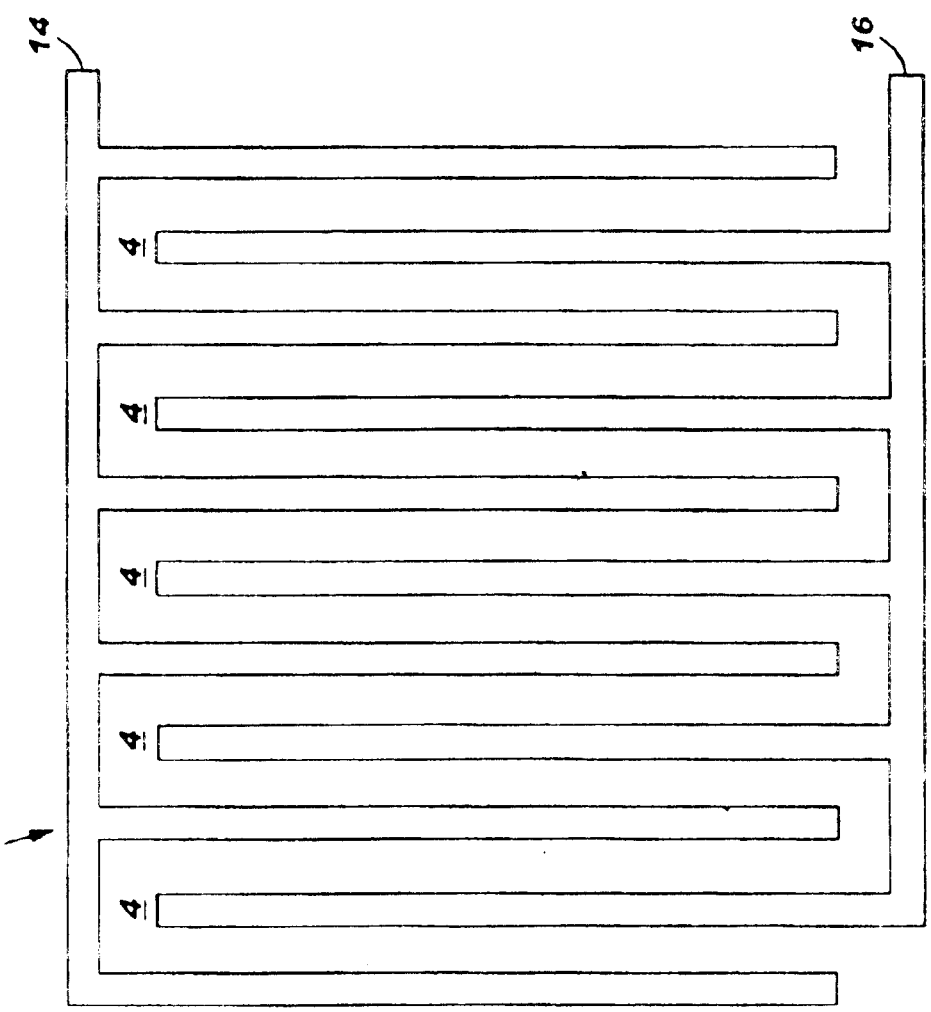
FIG. 7 illustrates a top view of the semiconductor device of FIG. 6, in accordance with embodiments of the present invention.

FIG. 7 illustrates a top view of the semiconductor device 2 of FIG. 6, in accordance with embodiments of the present invention. The capacitor 28 is formed by the conductive line 14, the conductive line 16, and the dielectric material there between. The dielectric material is the combination of the insulating layer 9 and the hard mask 4 (see FIG. 6). The conductive line 14 represents a first plate in the capacitor 28 and the conductive line 16 represents a second plate in the capacitor 28. If the hard mask 4 thickness increases, the capacitance between the conductive line 14 and the conductive line 16 increases since the hard mask 4 has a higher dielectric constant than does the insulating layer 9. Similarly, as the hard mask 4 thickness decreases, the capacitance between the conductive line 14 and the conductive line 16 decreases. The capacitance of the capacitor 28 is used to detect a presence or amount of hard mask 4 remaining on a plurality of insulating layers 9 on a plurality of levels on the semiconductor device 2 during of the semiconductor device 2 as described schematically by FIG. 8.

Figure 8:
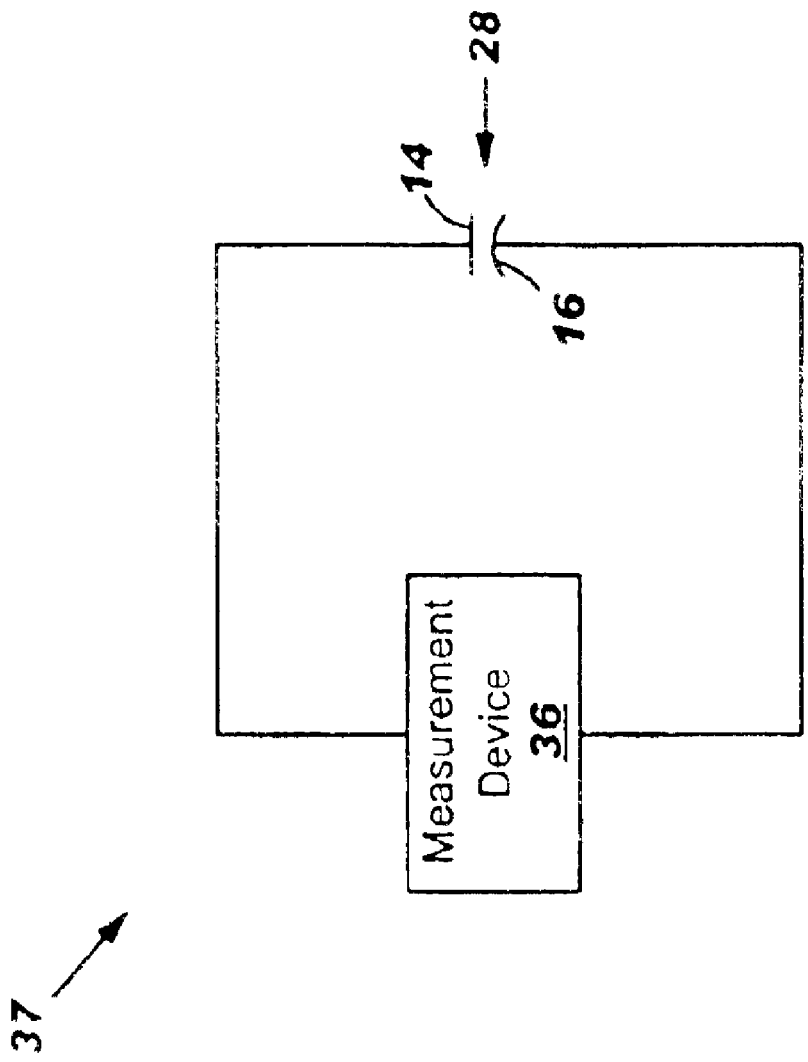
FIG. 8 illustrates schematic view of a circuit to obtain a capacitance measurement from the capacitor of FIG. 7, in accordance with embodiments of the present invention.

FIG. 8 illustrates schematic view of a circuit 37 to obtain a capacitance measurement from the capacitor 28 of FIG. 7, in accordance with embodiments of the present invention. The circuit 37 comprises the capacitor 28 a measurement device 36. The measurement device 36 is adapted to measure a capacitance of the capacitor 28 as is known to a person of ordinary skill in the art. The capacitance being dependent upon dielectric constant of the hard mask 4 and a dielectric constant of the insulating layer 9 is used to determine a thickness of the hard mask 4. The thickness of the hard mask 4 is determined by comparing the aforementioned values with calibration data. The calibration data comprises known capacitance values for known thicknesses of hard mask. The calibration data may also comprise known capacitance values for a plurality of geometric configurations of specified areas of hard mask that are missing, as well as calibration data for complex geometry's in which the thickness of the mask 4 is reduced and areas of the hard mask 4 are missing.

Figure 9:
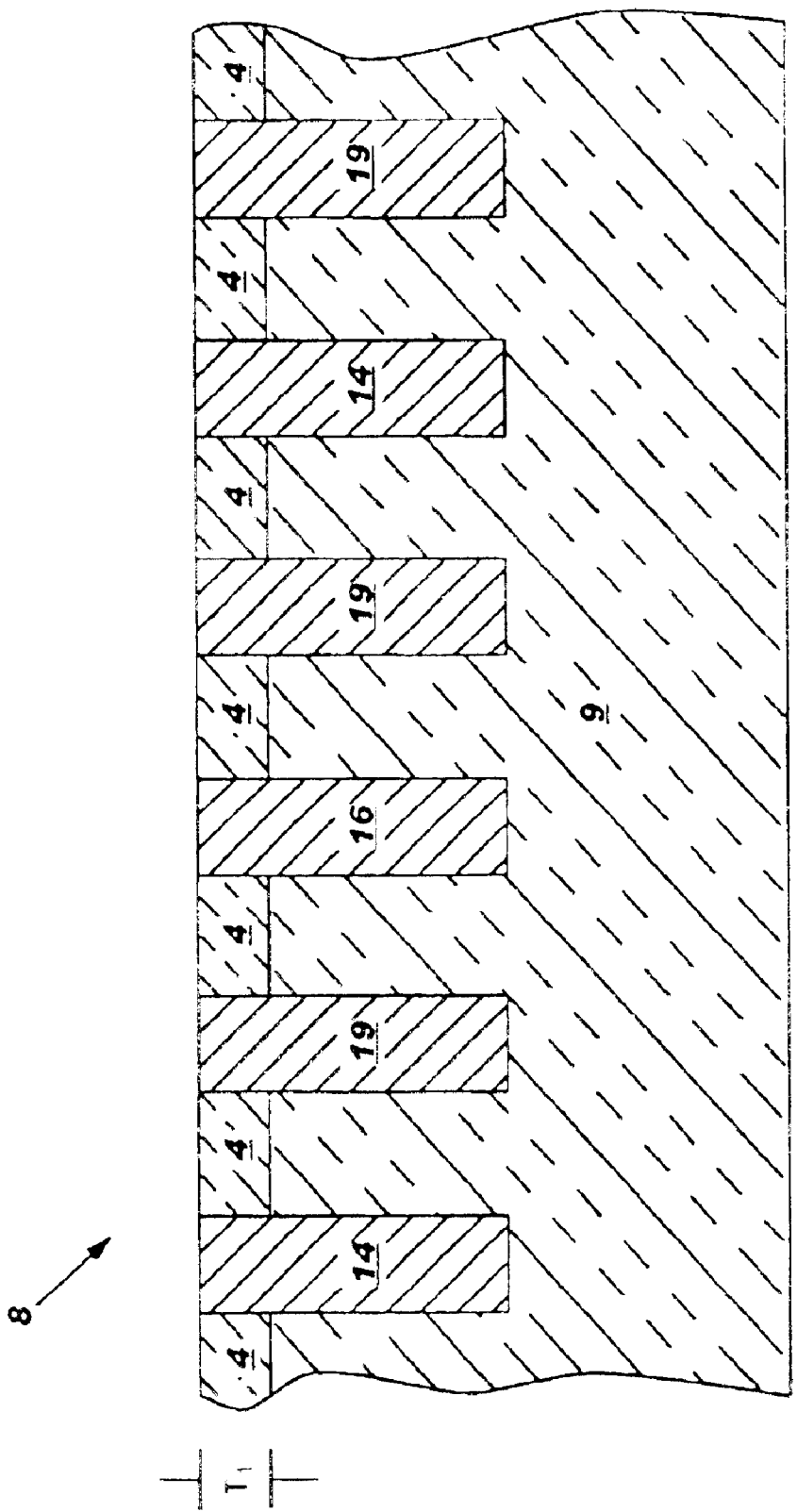
FIG. 9 illustrates an alternative embodiment to FIG. 6 showing a cross-sectional view of a semiconductor device, in accordance with embodiments of the present invention.

FIG. 9 illustrates an alternative embodiment to FIG. 6 showing a cross-sectional view of a semiconductor device 53 comprising a conductive line 14, a conductive line 16, and a conductive line 19 created using a damascene process, in accordance with embodiments of the present invention. In contrast with the semiconductor device 2 of FIG. 4, the semiconductor device 8 of FIG. 6 comprises the additional conductive line 19. The conductive line 19 may comprise a serpentine shape (see FIG. 10 for top view) and is located between the conductive line 14 and the conductive line 16.

Figure 10:
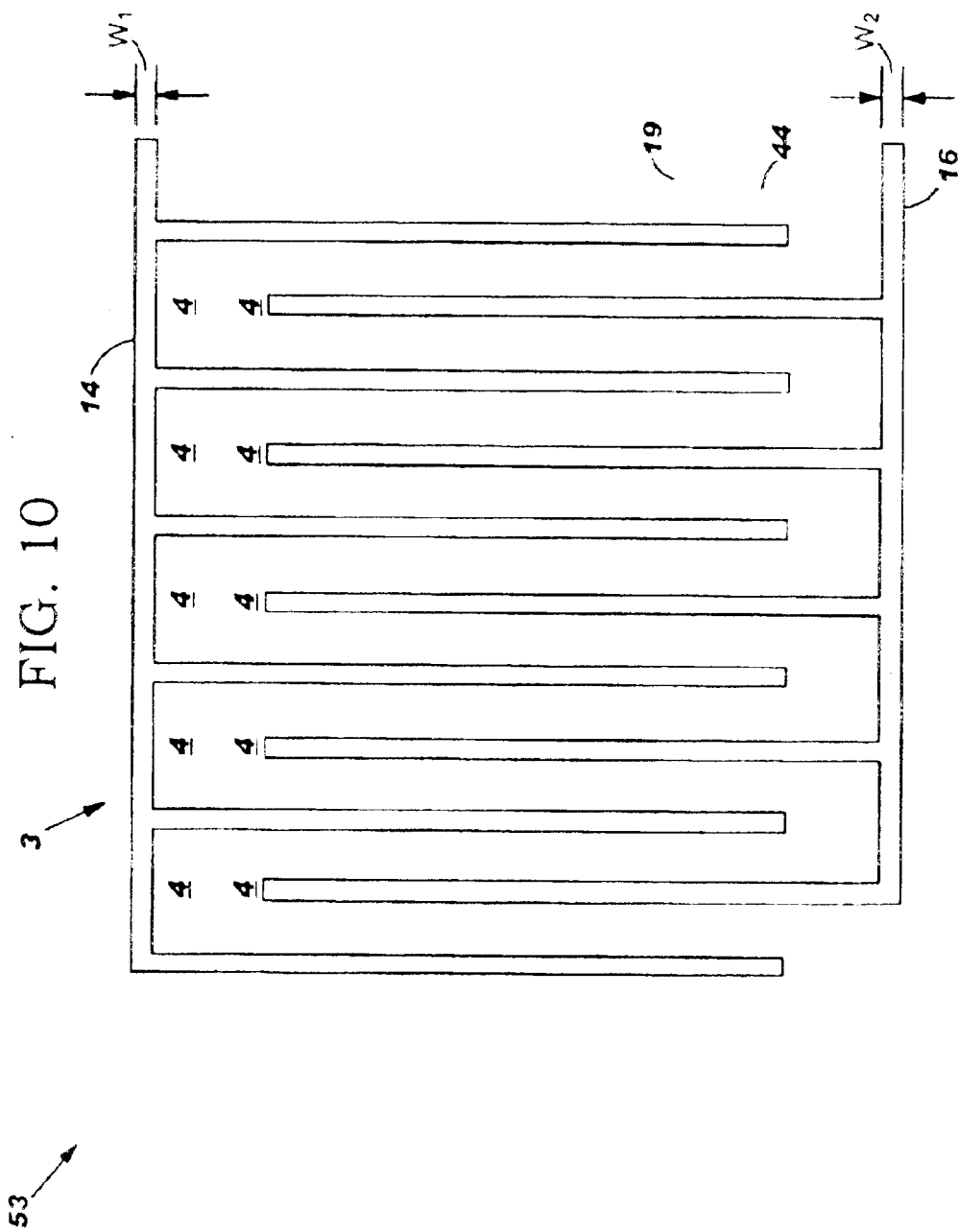
FIG. 10 illustrates a top view of the semiconductor device of FIG. 9, in accordance with embodiments of the present invention.

FIG. 10 illustrates a top view of the semiconductor device 53 of FIG. 9, in accordance with embodiments of the present invention. A capacitor 3 is formed by the conductive line 14, the conductive line 16, the conductive line 19, and the dielectric material there between. The dielectric material is the combination of the insulating layer 9 and the hard mask 4 (see FIG. 9). The conductive line 14 is electrically connected to the conductive line 16 and the combination of the conductive line 14 and the conductive line 16 represents a first plate in the capacitor 3 and the conductive line 19 represents a second plate in the capacitor 3 (i.e., see FIG. 8). If the hard mask 4 increases, the capacitance between the first plate represented by the conductive line 14 electrically connected to the conductive line 16 and the second plate represented by the conductive line 19 increases since the hard mask 4 has a higher dielectric constant than does the insulating layer 9. Similarly, as the hard mask 4 thickness decreases, the capacitance between the conductive line 14 electrically connected to the conductive line 16 and the conductive line 19 decreases. The capacitance of the capacitor 3 along with a resistance of the conductive line 19 is used to detect a presence or amount of hard mask 4 remaining on a plurality of insulating layers 9 on a plurality of levels on the semiconductor device during manufacturing of the semiconductor device 2. A measurement device such as the measurement device 36 in FIG. 8 is adapted to measure a capacitance of the capacitor 28 as is known to a person of ordinary skill in the art. The capacitance being dependent upon dielectric constant of the hard mask 4 and a dielectric constant of the insulating layer 9 along with a resistance of the conductive line 19 is used to determine a thickness of the hard mask 4. The thickness of the hard mask 4 is determined by comparing the aforementioned values with calibration data. The calibration data comprises known capacitance values for known thicknesses of hard mask. The calibration data may also comprise known capacitance values for a plurality of geometric configurations of specified areas of hard mask that are missing, as well as calibration data for complex geometry's in which the thickness of the mask 4 is reduced and areas of the hard mask 4 are missing. The conductive line 14 comprises a width $W_1$ and the conductive line 16 comprises a width $W_2$.

Figure 11:
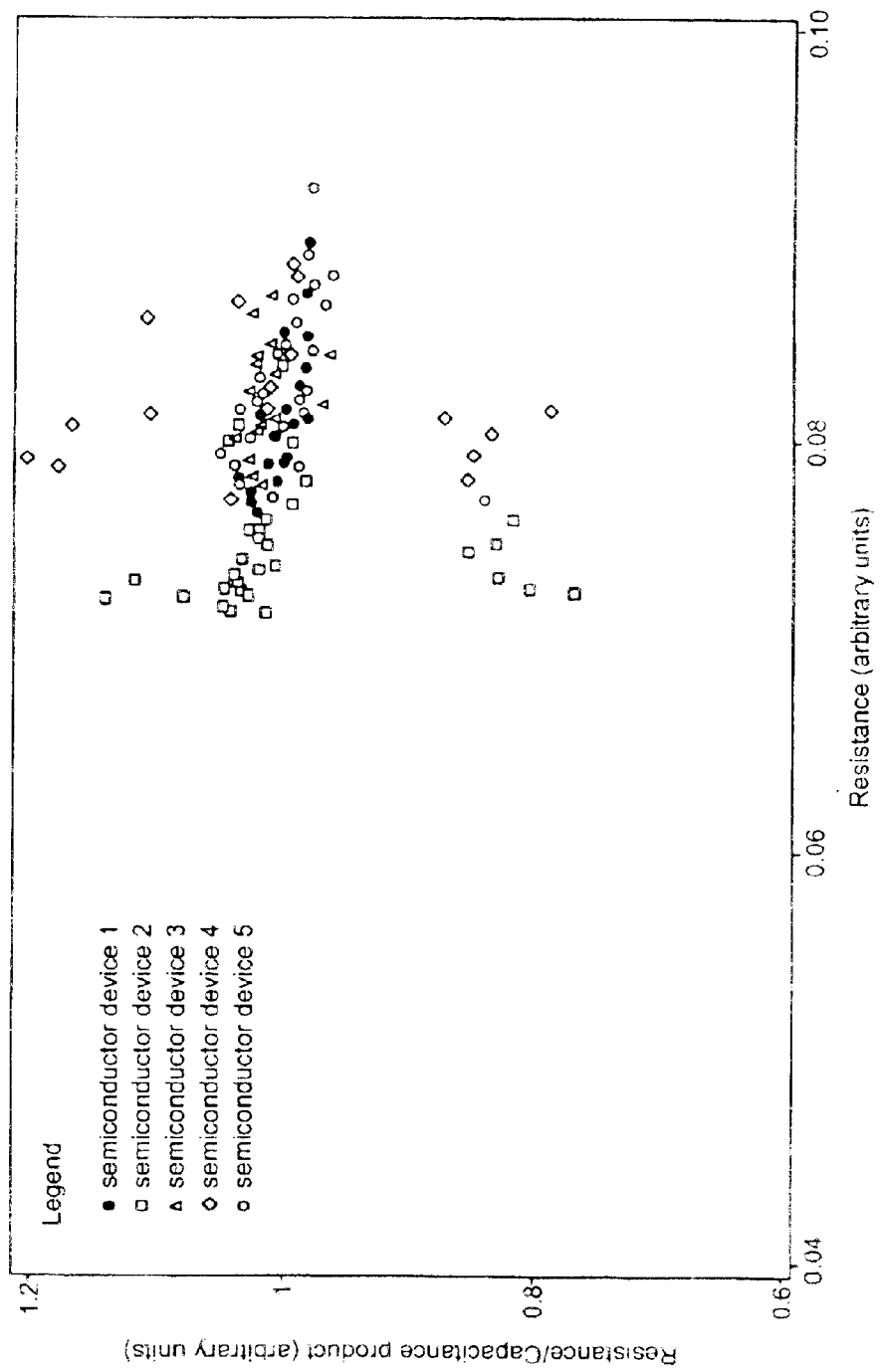
FIG. 11 illustrates a graph of resistance verses capacitance/resistance data for a plurality of semiconductor devices related to the semiconductor device in FIG. 10, in accordance with embodiments of the present invention.

FIG. 11 illustrates a graph of resistance verses capacitance/resistance data for a plurality of semiconductor devices 1–5 (i.e., semiconductor wafers) related to the semiconductor device 53 in FIG. 10, in accordance with embodiments of the present invention. Each of the plurality of semiconductor devices comprises a plurality of electrical components (i.e. semiconductor chips) represented on the graph by data points (see legend on graph). The Y-axis represents a capacitance measurement multiplied by a resistance measurement (i.e., see description of FIG. 10) in arbitrary units for each electrical component. The capacitance measurement is multiplied by the resistance measurement for each electrical component to first order normalize out the effect of wire dimension on capacitance for each electrical component (i.e., as wire width and wire height increases a capacitance increases and a resistance decreases at approximately the a same rate). The X-axis represents the resistance measurement in arbitrary units for each electrical component. Each of the data points have been normalized such that each of the data points have been divided by a median value (i.e., 50th percentile) for it's corresponding semiconductor device thereby causing the median of the data to be 1. The graph in FIG. 11 shows that the data points comprising a resistance/capacitance (R/C) product that is at least 5% lower than 1 does not have enough hard mask and the data points comprising an R/C product that is at least 5% higher than 1 may have two layers of hard mask remaining with an upper layer of hard mask having a higher relative dielectric constant than a dielectric constant of a lower layer of hard mask. Therefore the present invention may adapted to detect a thin or missing hard mask layer or the present invention may adapted detect the presence and thickness of hard mask layers when two or more films with different dielectric constants are used for the hard mask.

FIG. 12 illustrates a wafer map comprising capacitance and resistance data for one semiconductor device (i.e., semiconductor wafer) related to the semiconductor device 53 in FIG. 10, in accordance with embodiments of the present invention. The semiconductor device comprises a plurality of electrical components (i.e. semiconductor chips). Each of the plurality of electrical components is given an x coordinate and a y coordinate on the semiconductor device as shown by the columns and rows on the wafer map. Each electrical component in each location on the wafer map comprises a capacitance measurement (lower number) in Nano Farads and a resistance measurement (upper number) in ohms/micron. The wafer map shows a variation in measurements between electrical components. For example, row 16, column 1 shows an electrical component comprising a capacitance measurement of 0.06776 and a resistance measurement of 0.69864. The capacitance measurement is much lower than any of the other capacitance measurements, thereby indicating an electrical component that is missing hard mask.

Figure 13:
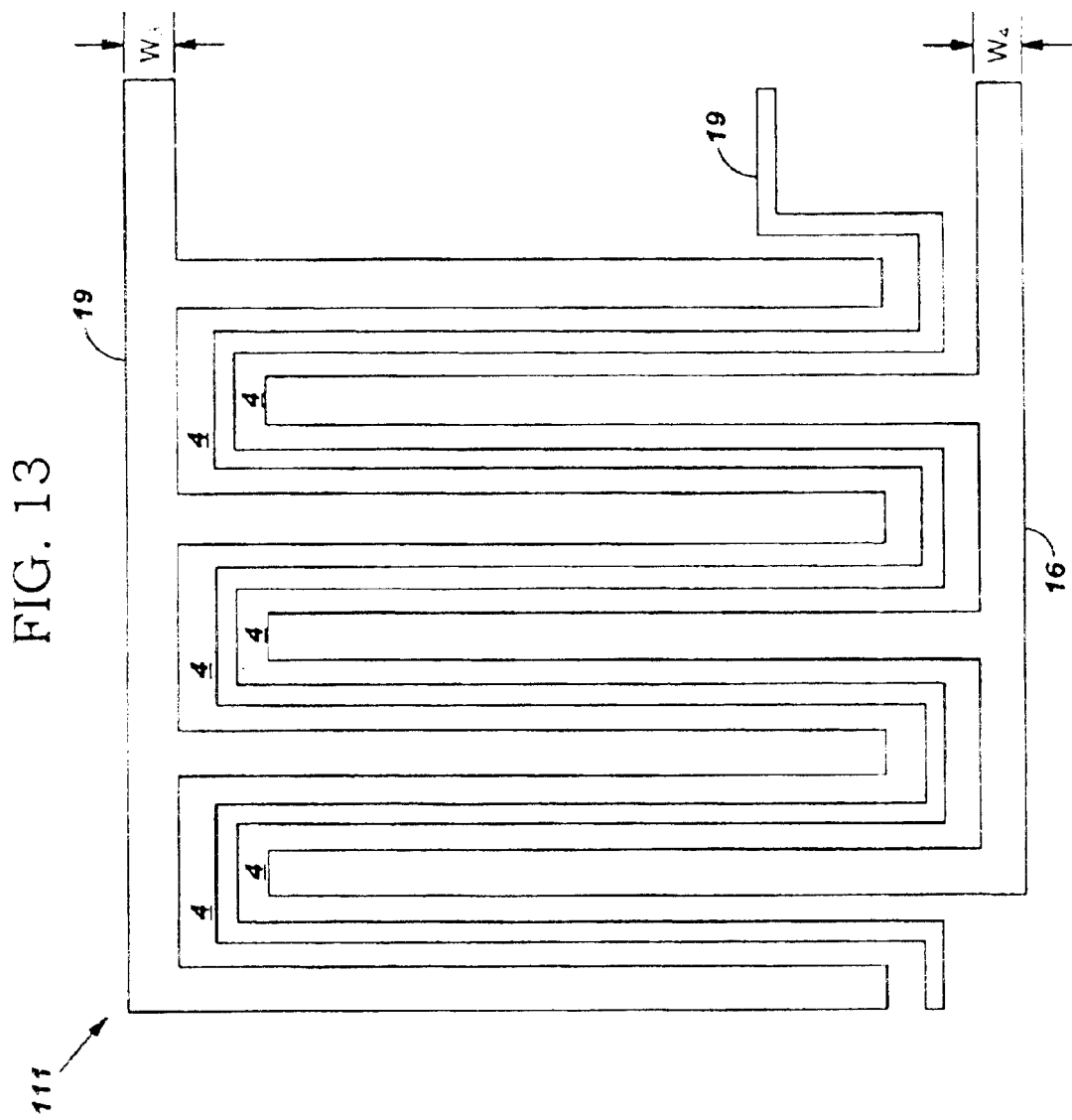
FIG. 13 illustrates an alternative embodiment to FIG. 10 showing a top view of a semiconductor device, in accordance with embodiments of the present invention.

FIG. 13 illustrates an alternative embodiment to FIG. 10 showing a top view of a semiconductor device 111, in accordance with embodiments of the present invention. In contrast with the semiconductor device 53 of FIG. 10, the semiconductor device 111 of FIG. 13 comprises the conductive line 14 with a width $W_3$ and the conductive line 16 with a width $W_4$. The width $W_3$ and the width $W_4$ each comprise a width that is greater than the width $W_1$ and the width W2 in FIG. 10. Therefore the semiconductor device 111 comprises high conductive line 14 and 16 pattern factor representing an area that is likely to have a lesser amount of hard mask therefore representing a worst case scenario.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A detection system, comprising:
    means for performing a test on a semiconductor device and obtaining test data therefrom, wherein the semiconductor device includes an insulating layer, a hard mask layer on a surface of the insulating layer, and a plurality of electrically conductive lines within a trench in the insulating layer, wherein the insulating layer comprises a first dielectric material, wherein the hard mask layer comprises a second dielectric material, wherein the dielectric constant of the second dielectric material exceeds the dielectric constant of the first dielectric material or the second dielectric material comprises an element that is not comprised by the first dielectric material, and wherein the test data is a function of a spatial distribution of the hard mask layer on the surface of the insulating layer; and
    means for determining from said test data a measure of said spatial distribution of the hard mask layer on the surface of the insulating layer.

2. The detection system of claim 1, wherein said measure provides an indication of a presence or absence of the hard mask layer on a localized portion of the surface of the insulating layer.

3. The detection system of claim 2, wherein said means for performing comprises means for directing a photon beam toward the localized portion of the surface of the insulating layer of the semiconductor device resulting in a consequent electron beam comprising said test data returned from the semiconductor device, wherein said means for performing further comprises means for measuring an energy of the electron beam resulting in a measured energy of the electron beam, wherein said test data comprises said measured energy of the electron beam, and wherein said means for determining comprises means for comparing said measured energy of the electron beam with existing calibration data.

4. The detection system of claim 1, wherein said measure provides an indication of a thickness of the hard mask layer on a localized portion of the surface of the insulating layer.

5. The detection system of claim 4, wherein said means for performing comprises means for directing an electron beam toward the localized portion of the surface of the insulating layer of the semiconductor device resulting in a consequent photon beam returned from the semiconductor device, wherein said means for performing further comprises means for measuring an energy of the photon beam resulting in a measured energy of the photon beam, wherein said test data comprises said measured energy of the photon beam, and wherein said means for determining comprises means for comparing said measured energy of the photon beam with existing calibration data.

6. The detection system of claim 1, wherein said measure provides an indication of a presence or absence of the hard mask layer on the surface of the insulating layer.

7. The detection system of claim 1, wherein said measure provides an indication of a thickness distribution of the hard mask layer on the surface of the insulating layer.

8. The detection system of claim 7, wherein said means for performing comprises means for measuring a capacitance between a pair of electrically conductive lines of the plurality of electrically conductive lines resulting a measured capacitance between said pair of electrically conductive lines, wherein said test data comprises said measured capacitance, and wherein said means for determining comprises means for comparing said measured capacitance with existing calibration data.

9. The detection system of claim 7, wherein said means for performing comprises means for measuring a capacitance between a first electrically conductive line of the plurality of electrically conductive lines electrically coupled to a second electrically conductive line of the plurality of electrically conductive lines and a third electrically conductive line of the plurality of electrically conductive lines resulting a measured capacitance between said electrically conductive lines, wherein said means for performing further comprises means for measuring a resistance of the third electrically conductive line of the plurality of electrically conductive lines resulting a measured resistance of the third electrically conductive line, wherein said means for performing further comprises means for multiplying the measured capacitance with the measured resistance resulting in a product, wherein said test data comprises said product, and wherein said means for determining comprises means for comparing said product with existing calibration data.

10. The detection system of claim 1, wherein the spatial distribution of the hard mask remaining on the surface of the insulating layer is used to determine whether the semiconductor device is to be accepted or rejected.

11. A detection method, comprising:
    performing a test on a semiconductor device and obtaining test data therefrom, wherein the semiconductor device includes an insulating layer, a hard mask layer on a surface of the insulating layer, and a plurality of electrically conductive lines within a trench in the insulating layer, wherein the insulating layer comprises a first dielectric material, wherein the hard mask layer comprises a second dielectric material, wherein the dielectric constant of the second dielectric material exceeds the dielectric constant of the first dielectric material or the second dielectric material comprises an element that is not comprised by the first dielectric material, and wherein the test data is a function of a spatial distribution of the hard mask layer on the surface of the insulating layer; and
    determining from said test data a measure of said spatial distribution of the hard mask layer on the surface of the insulating layer.

12. The detection method of claim 11, wherein said measure provides an indication of a presence or absence of the hard mask layer on a localized portion of the surface of the insulating layer.

13. The detection method of claim 12, wherein said performing comprises directing a photon beam toward the localized portion of the surface of the insulating layer of the semiconductor device resulting in a consequent electron beam returned from the semiconductor device, wherein said performing further comprises measuring an energy of the electron beam resulting in a measured energy of the electron beam, wherein said test data comprises said measured energy of the electron beam, and wherein said determining comprises comparing said measured energy of the electron beam with existing calibration data.

14. The detection method of claim 11, wherein said measure provides an indication of a thickness of the hard mask layer on a localized portion of the surface of the insulating layer.

15. The detection method of claim 14, wherein said performing comprises directing an electron beam toward the localized portion of the surface of the insulating layer of the semiconductor device resulting in a consequent photon beam returned from the semiconductor device, wherein said performing further comprises measuring an energy of the photon beam resulting in a measured energy of the photon beam, wherein said test data comprises said measured energy of the photon beam, and wherein said determining comprises comparing said measured energy of the photon beam with existing calibration data.

16. The detection method of claim 11, wherein said measure provides an indication of a presence or absence of the hard mask layer on the surface of the insulating layer.

17. The detection method of claim 11, wherein said measure provides an indication of a thickness distribution of the hard mask layer on the surface of the insulating layer.

18. The detection method of claim 17, wherein said performing comprises measuring a capacitance between a pair of electrically conductive lines of the plurality of electrically conductive lines resulting a measured capacitance between said pair of electrically conductive lines, wherein said test data comprises said measured capacitance, and wherein said determining comprises comparing said measured capacitance with existing calibration data.

19. The detection method of claim 17, wherein said performing comprises measuring a capacitance between a first electrically conductive line of the plurality of electrically conductive lines electrically coupled to a second electrically conductive line of the plurality of electrically conductive lines and a third electrically conductive line of the plurality of electrically conductive lines resulting a measured capacitance between said electrically conductive lines, wherein said performing further comprises measuring a resistance of the third electrically conductive line of the plurality of electrically conductive lines resulting a measured resistance of the third electrically conductive line, wherein said performing further comprises means for multiplying the measured capacitance with the measured resistance resulting in a product, wherein said test data comprises said product, and wherein said determining comprises comparing said product with existing calibration data.

20. The detection method of claim 11, further comprising using the spatial distribution of the hard mask remaining on the surface of the insulating layer to determine whether the semiconductor device is to be accepted or rejected.

* * * * *